(12) United States Patent
Tamiya

(10) Patent No.: US 9,753,084 B2
(45) Date of Patent: Sep. 5, 2017

(54) DEBUG CIRCUIT, SEMICONDUCTOR DEVICE, AND DEBUG METHOD

(71) Applicant: FUJITSU LIMITED, Kawasaki-shi, Kanagawa (JP)

(72) Inventor: Yutaka Tamiya, Yokohama (JP)

(73) Assignee: FUJITSU LIMTIED, Kawasaki (JP)

( * ) Notice: Subject to any disclaimer, the term of this patent is extended or adjusted under 35 U.S.C. 154(b) by 62 days.

(21) Appl. No.: 14/751,405

(22) Filed: Jun. 26, 2015

(65) Prior Publication Data
US 2016/0084906 A1    Mar. 24, 2016

(30) Foreign Application Priority Data

Sep. 22, 2014 (JP) ................................. 2014-192088

(51) Int. Cl.
*G01R 31/317* (2006.01)
(52) U.S. Cl.
CPC .............................. *G01R 31/31705* (2013.01)
(58) Field of Classification Search
CPC ......... G11C 29/52; G11C 16/26; G11C 16/08; G11C 16/3445; G11C 16/3459; G11C 2029/0411; G06F 11/1016; G06F 11/1048; G06F 11/2205; G06F 2212/403; G06F 3/0688; G01R 31/31703; G01R 31/31705; H04L 1/0042; H03M 13/09
See application file for complete search history.

(56) References Cited

U.S. PATENT DOCUMENTS

| | | | | |
|---|---|---|---|---|
| 4,414,669 A | * | 11/1983 | Heckelman | G06F 11/10 714/800 |
| 4,569,049 A | * | 2/1986 | McNamara | G06F 11/2221 714/52 |
| 5,611,043 A | * | 3/1997 | Even | G06F 11/362 714/38.13 |

(Continued)

FOREIGN PATENT DOCUMENTS

| | | | | |
|---|---|---|---|---|
| JP | 10-3404 | * | 1/1998 | ............... G06F 11/28 |
| JP | 2003-46393 | * | 2/2003 | ............... G06F 11/10 |

OTHER PUBLICATIONS

Furuya, "Data Sampling Method/Device for Hardware", JP 10-3404, Jan. 6, 1998, (English Abstract and English Translation).*

(Continued)

*Primary Examiner* — April Y Blair
*Assistant Examiner* — Rong Tang
(74) *Attorney, Agent, or Firm* — Fujitsu Patent Center

(57) ABSTRACT

A debug circuit, includes: a controller to start a debugging of a circuit based on first and second code values, the first code value obtained by encoding a first sequence included in a processing sequence indicating a condition for a process of the circuit, the second code value obtained by encoding a second sequence subsequent to the first sequence, wherein the controller performs to: calculate a third code value as a current code value based on signals input and output to the circuit; output, as a fourth code value, a previous third code value that is earlier than the current code value; detect the first sequence by comparing a difference between the third code value and the fourth code value with the first code value; calculate a first expected value of the third code value; and perform the process when the third code value and the first expected value match.

19 Claims, 15 Drawing Sheets

(56) References Cited

U.S. PATENT DOCUMENTS

| | | | | |
|---|---|---|---|---|
| 6,334,201 | B1* | 12/2001 | Sawaguchi | G11B 20/10009 714/795 |
| 2002/0144235 | A1* | 10/2002 | Simmers | G06F 11/3648 717/124 |
| 2003/0037257 | A1* | 2/2003 | Wang | G06F 11/3636 726/22 |
| 2007/0168732 | A1* | 7/2007 | Liu | G06F 11/263 714/30 |
| 2013/0346814 | A1* | 12/2013 | Zadigian | G01R 31/28 714/724 |
| 2016/0282413 | A1* | 9/2016 | Tamiya | G01R 31/31703 |

OTHER PUBLICATIONS

M. Walma, "Pipelined Cyclic Redundancy Check (CRC) Calculation", Proc. of 16th Int'l Conf. on Computer Communications and Networks, pp. 365-370, 2007.*

T. Matsumoto, "Error Detector", JP 2003-46393, Feb. 14, 2003, (English Abstract and Translation).*

Mathys Walma, "Pipelined Cyclic Redundancy Check (CRC) Calculation", Proc. of 16th Int'l Conf. on Computer and Networks, 2007 IEEE, pp. 365-370 (6 pages).

* cited by examiner

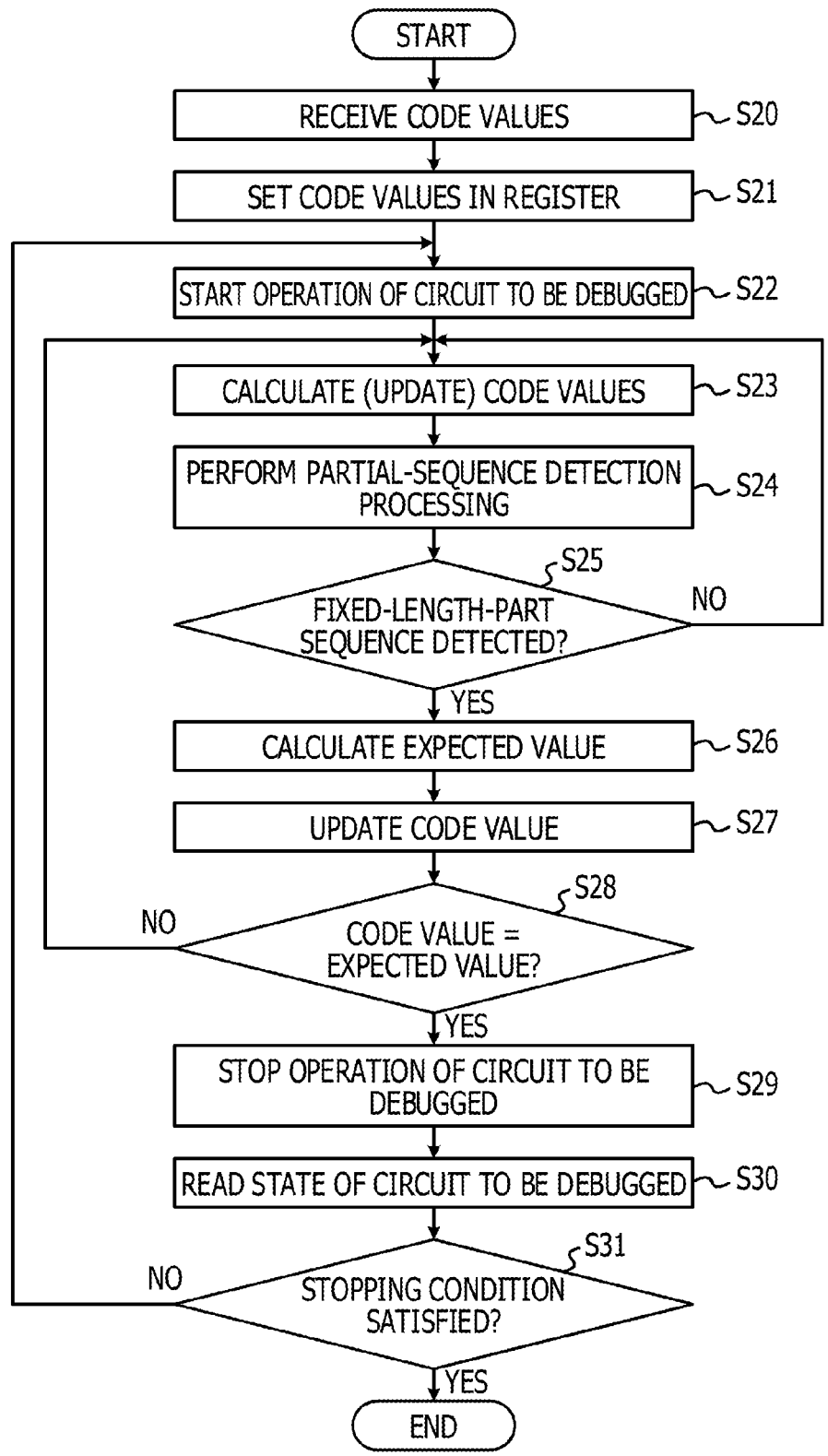

US 9,753,084 B2

DEBUG CIRCUIT, SEMICONDUCTOR DEVICE, AND DEBUG METHOD

CROSS-REFERENCE TO RELATED APPLICATION

This application is based upon and claims the benefit of priority of the prior Japanese Patent Application No. 2014-192088, filed on Sep. 22, 2014, the entire contents of which are incorporated herein by reference.

FIELD

The embodiments discussed herein are related to a debug circuit, a semiconductor device, and a debug method.

BACKGROUND

In debugging of an actual device, whether or not the hardware thereof operates properly is checked.

A related technology is disclosed in Japanese Laid-open Patent Publication No. 10-3404 or Non-Patent Literature: M. Walma, "Pipelined Cyclic Redundancy Check (CRC) Calculation", Proc. of 16th Int'l Conf. on Computer Communications and Networks, pp. 365-370, 2007.

SUMMARY

According to an aspect of the embodiments, a debug circuit, includes: a controller configured to start a debugging of a circuit to be debugged based on a first code value and a second code value, the first code value being obtained by encoding, using an encoding system, a first sequence included in a processing sequence indicating a condition for a process of the circuit, the second code value being obtained by encoding, using the encoding system, a second sequence subsequent to the first sequence included in the processing sequence, wherein the controller performs operations to: calculate, using an encoding system, a third code value as a current code value based on signals input and output to the circuit; output, as a fourth code value, a previous third code value that is earlier than the current core value by a time length corresponding to a length of the first sequence; detect the first sequence based on a result of comparing a difference between the third code value and the fourth code value with the first code value; calculate a first expected value of the third code value at an end of the processing sequence, based on the third code value when detecting the first sequence and the second code value; and perform the process on the circuit when the third code value and the first expected value match with each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15 illustrates an example of a debug method using a trace buffer.

DESCRIPTION OF EMBODIMENTS

For example, in a logic analyzer scheme, which is a scheme for debugging actual devices, a circuit for debugging is provided during implementation of the circuit to be debugged, and debugging is performed.

In the logic analyzer scheme, the circuit for debugging monitors temporal change in a signal in a circuit to be debugged that is specified by a user. When the value of the signal matches a certain stopping condition, the circuit for debugging causes the operation of the circuit to be debugged to stop and outputs, to a display apparatus or the like, the temporal change in the signal which stored in a trace memory.

In debugging of software, a break point is used to cause a program to stop with various conditions. For example, in debugging of hardware, because of hardware constrains, such as the capacity of the trace memory and the number of signal lines that are usable for debugging, it may be difficult to cause the hardware to stop with a condition or timing intended by a user.

Figure 1:
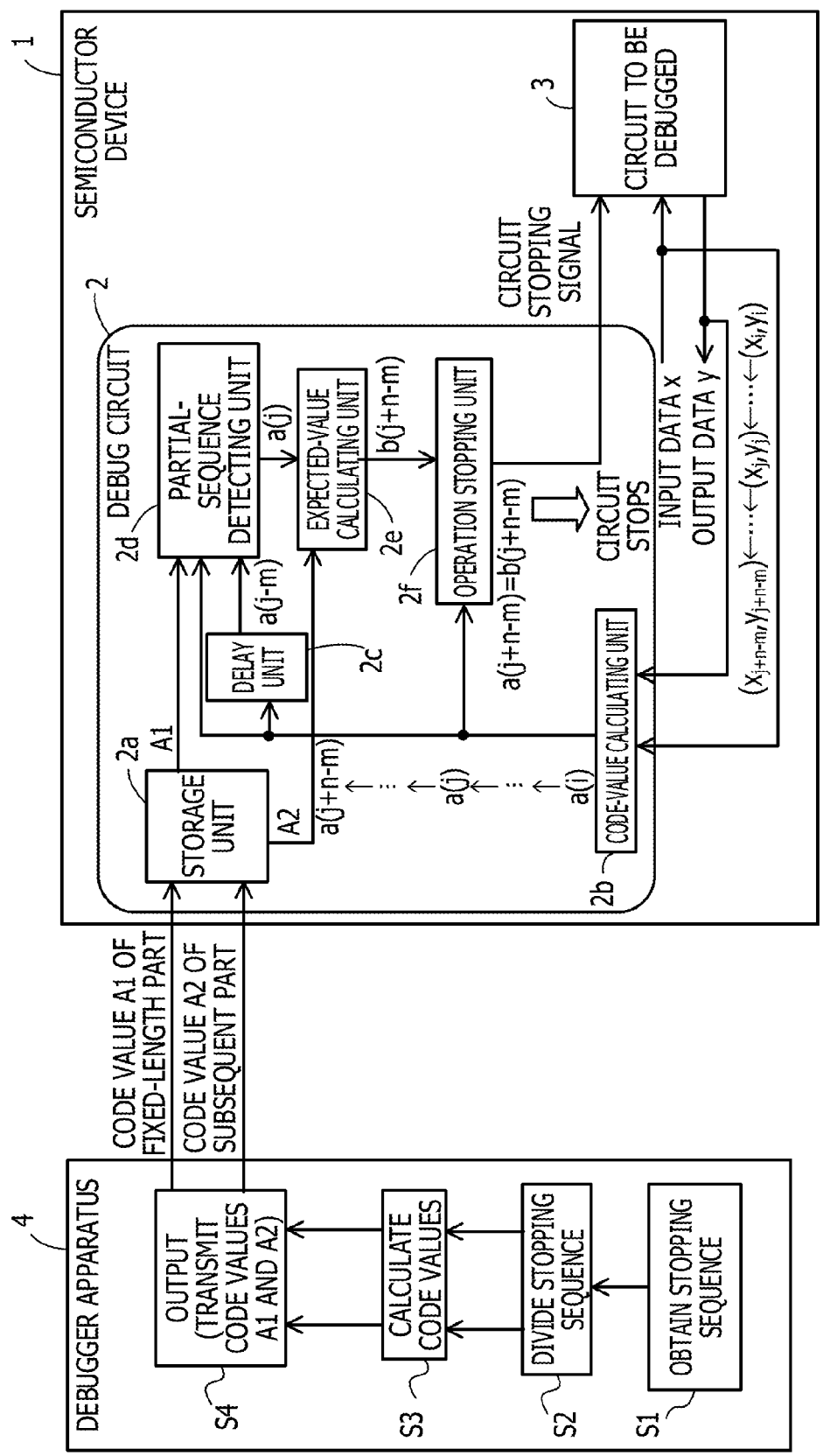
FIG. 1 illustrates an example of a debug system.

FIG. 1 illustrates an example of a debug system. The debug system illustrated in FIG. 1 includes a semiconductor device 1 and a debugger apparatus 4.

The semiconductor device 1 includes a debug circuit 2 and a circuit 3 to be debugged, which is hardware. The debug circuit 2 is a circuit for stopping, with a certain stopping condition, the operation of the circuit 3 to be debugged. The debug circuit 2 has a storage unit 2a, a code-value calculating unit 2b, a delay unit 2c, a partial-sequence detecting unit 2d, an expected-value calculating unit 2e, and an operation stopping unit 2f.

The storage unit 2a stores code values obtained by encoding a fixed-length-part sequence and a subsequent-part sequence that are included in a stopping sequence indicating a stopping condition for the circuit 3 to be debugged. The fixed-length-part sequence has a fixed length, and the subsequent-part sequence may have an arbitrary length. The code values obtained by encoding the fixed-length-part sequence are referred to as "code values A1", and the code values obtained by encoding the subsequent-part sequence are referred to as "code values A2".

The code values A1 and A2 may be calculated using an encoding system by which the values change in response to a sequence of signals regarding the circuit 3 to be debugged. Although the stopping sequence is represented by two code values A1 and A2 corresponding to the fixed-length-part sequence and the subsequent-part sequence, the stopping sequence may also be represented by three or more code values corresponding to three or more partial sequences.

The code values A1 and A2 may be, for example, code values having linearity, for example, linear codes, and are calculated by the debugger apparatus 4 by using an encoding system, such as cyclic redundancy check (CRC). Based on a sequence of signals regarding the circuit 3 to be debugged, the code-value calculating unit 2*b* may calculate code values by using an encoding system that is the same as or similar to the encoding system for the debugger apparatus 4 to calculate the code values A1 and A2. The code-value calculating unit 2*b* may calculate code values on a regular basis. For example, the code-value calculating unit 2*b* updates the code values based on signals of the circuit 3 to be debugged, at each timing of a received clock, for example, at a rise or fall timing of a received signal. The stopping sequence may be a sequence of signals at each timing of a clock.

FIG. 1 illustrates an example of code values calculated when input data x and output data y, which are signals of the circuit 3 to be debugged, transition from the state of $(x_i, y_i)$ to $(x_i, y_i) \rightarrow \ldots \rightarrow (x_j, y_j) \rightarrow \ldots \rightarrow (x_{j+n-m}, y_{j+n-m})$. The state of $(x_i, y_i)$ may be an initial state or may be a state in the middle of a sequence. Also, i, j, and j+n-m each indicate a time point (a clock timing). When the input data x and the output data y change, the code values in FIG. 1 are updated in the order $a(i) \rightarrow \ldots \rightarrow a(j) \rightarrow \ldots \rightarrow a(j+n-m)$.

The delay unit 2*c* outputs a code value for a time point that is earlier by a time length corresponding to the length of the fixed-length-part sequence of the stopping sequence, the code value being calculated by the code-value calculating unit 2*b*. For example, the delay unit 2*c* is a shift register. The delay unit 2*c* holds the code values corresponding to a fixed length, the code values being calculated by the code-value calculating unit 2*b*, and then sequentially outputs the code values on a first-in, first-out basis. For example, the delay unit 2*c* delays outputting of the input code values.

The stopping sequence may hereinafter be treated as a sequence of signals of the circuit 3 to be debugged at each time point (clock timing). The length of the fixed-length-part sequence of a stopping sequence may be set to the length of a sequence of signals for m time points. The length of the stopping sequence may be the length of a sequence of signals for n time points.

In FIG. 1, a code value a(j−m) is output from the delay unit 2*c*. The code value a(j−m) is a code value for a time point that is m time points earlier relative to the code value a(j). Based on a result of comparing the difference between the code value output from the code-value calculating unit 2*b* and the code value output from the delay unit 2*c* with the code value A1, the partial-sequence detecting unit 2*d* detects the fixed-length-part sequence of the stopping sequence. For example, based on a result of comparing the amount of change in the code values for m time points with the code value A1, the partial-sequence detecting unit 2*d* detects the fixed-length-part sequence.

For example, when the difference between the code value output from the code-value calculating unit 2*b* and the code value output from the delay unit 2*c* corresponds to the code value A1, the partial-sequence detecting unit 2*d* may detect that the signal of the circuit 3 to be debugged has transitioned in the fixed-length-part sequence of the stopping sequence.

For example, when the code value a(j) is output from the code-value calculating unit 2*b*, the code value a(j−m) is output from the delay unit 2*c*, and the difference between the code value a(j) and the code value a(j−m) corresponds to the code value A1, the fixed-length-part sequence of the stopping sequence may be detected.

Upon detecting the fixed-length-part sequence of the stopping sequence, the partial-sequence detecting unit 2*d* supplies the code value when it is detected to the expected-value calculating unit 2*e*. In FIG. 1, the code value a(j) is supplied to the expected-value calculating unit 2*e*.

Based on the code value when the fixed-length-part sequence is detected and the code value A2, the expected-value calculating unit 2*e* calculates an expected value of the code value calculated by the code-value calculating unit 2*b* at the end of the stopping sequence.

For example, in a case where the code value when the fixed-length-part sequence is detected is the code value a(j), the expected-value calculating unit 2*e* calculates an expected value b(j+n−m) by using an XOR arithmetic operation of the code value a(j) and the code value A2 (see equation (3)).

When the code value output from the code-value calculating unit 2*b* and the expected value match with each other, the operation stopping unit 2*f* stops the circuit 3 to be debugged. In FIG. 1, the code value a(j+n−m) output from the code-value calculating unit 2*b* matches the expected value b(j+n−m). In this case, the operation stopping unit 2*f* outputs a circuit stopping signal for instructing to stop the operation of the circuit 3 to be debugged.

For example, based on the circuit stopping signal, the operation stopping unit 2*f* may stop the operation of the circuit 3 to be debugged, by stopping supply of a clock signal to the circuit 3 to be debugged. When the operation stopping unit 2*f* blocks inputting of data to the circuit 3 to be debugged or outputting of data from the circuit 3 to be debugged, the circuit 3 to be debugged may be treated as being stopped.

The debugger apparatus 4 may be an apparatus that performs debugging through communication with the semiconductor device 1. The debugger apparatus 4 may be, for example, a computer and may use software to perform processing described below. The debugger apparatus 4 obtains a stopping sequence from a user, for example, an operator for debugging (operation S1). The debugger apparatus 4 divides the stopping sequence into a fixed-length sequence of a first half part thereof and a sequence of the last half part (operation S2) and calculates code values A1 and A2 obtained by encoding the fixed-length-part sequence and the subsequent-part sequence (operation S3). The debugger apparatus 4 outputs (transmits) the calculated code values A1 and A2 to the semiconductor device 1 (operation S4).

In the debug system including the semiconductor device 1 and the debugger apparatus 4, debugging is performed. The code values A1 and A2 calculated and transmitted by the debugger apparatus 4 in the processes in operations S1 to S4 are stored in the storage unit 2*a* in the debug circuit 2 in the semiconductor device 1.

The debug circuit 2 detects a transition in the signal of the circuit 3 to be debugged. For example, in FIG. 1, the code-value calculating unit 2*b* updates the code values, based on the sequence of the input data x or the output data y.

For example, when the input data x and the output data y of the circuit 3 to be debugged transitions in the order $(x_i, y_i) \rightarrow \ldots \rightarrow (x_j, y_j)$, the code value is updated in the order $a(i) \rightarrow \ldots \rightarrow a(j)$, as illustrated in FIG. 1.

When the code value a(j) is output from the code-value calculating unit 2*b*, and the difference between the code value a(j) and the code value a(j−m) output from the delay unit 2*c* corresponds to the code value A1, the partial-sequence detecting unit 2*d* supplies the code value a(j) to the expected-value calculating unit 2e. Based on the code value a(j+n−m) and the code value A2, the expected-value calculating unit 2e calculates the expected value b(j+n−m).

The input data x and the output data y further transition from the state of $(x_j, y_j)$ to $(x_{j+n-m}, y_{j+n-m})$. In this case, when the code value a(j+n−m) output from the code-value calculating unit 2b matches the expected value b(j+n−m), the operation stopping unit 2f determines that the sequence of signals of the circuit 3 to be debugged corresponds to the stopping condition and stops the operation of the circuit 3 to be debugged.

For example, the debugger apparatus 4 may perform debugging work, such as checking signals of the individual units in the circuit 3 to be debugged. The debug circuit 2 identifies the fixed-length part of the stopping sequence in the sequence of signals of the circuit 3 to be debugged, based on the amount of change (the above-described difference) in the code value output from the code-value calculating unit 2b. The debug circuit 2 identifies the subsequent part of the stopping sequence by using the code value and the absolute value of the code value. Thus, since the stopping condition is identified based on a sequence whose initial state is unknown, the work efficiency may increase. For example, even when the state of $(x_i, y_j)$ for the input data x and the output data y is in the middle of a sequence, not the initial state, the stopping condition may be identified. For example, the stopping condition may be detected from an arbitrary sequence. When the initial state of the circuit 3 to be debugged is unknown, the circuit operation may be stopped upon detection of the stopping condition.

When code values as described above are used, the circuit 3 to be debugged is easily stopped with various conditions even if there is a hardware constraint, and the work efficiency for debugging may increase. Since the debug circuit 2 performs processing using code values having a small amount of data, rather than directly dealing with the input data x and the output data y, the processing may be performed in a small-scale circuit, and the operation may be performed at high speed.

When a complicated sequence is a stopping condition, the stopping condition is also represented as code values, and thus the capacity of the storage unit 2a decreases. Thus, the circuit areas of the debug circuit 2 and the semiconductor device 1 may decrease.

When the stopping condition is changed, it is sufficient for the storage unit 2a to store code values obtained by encoding a sequence indicating a stopping condition. Thus, the work efficiency of debugging may increase without performing re-implementation of a circuit.

Figure 2:
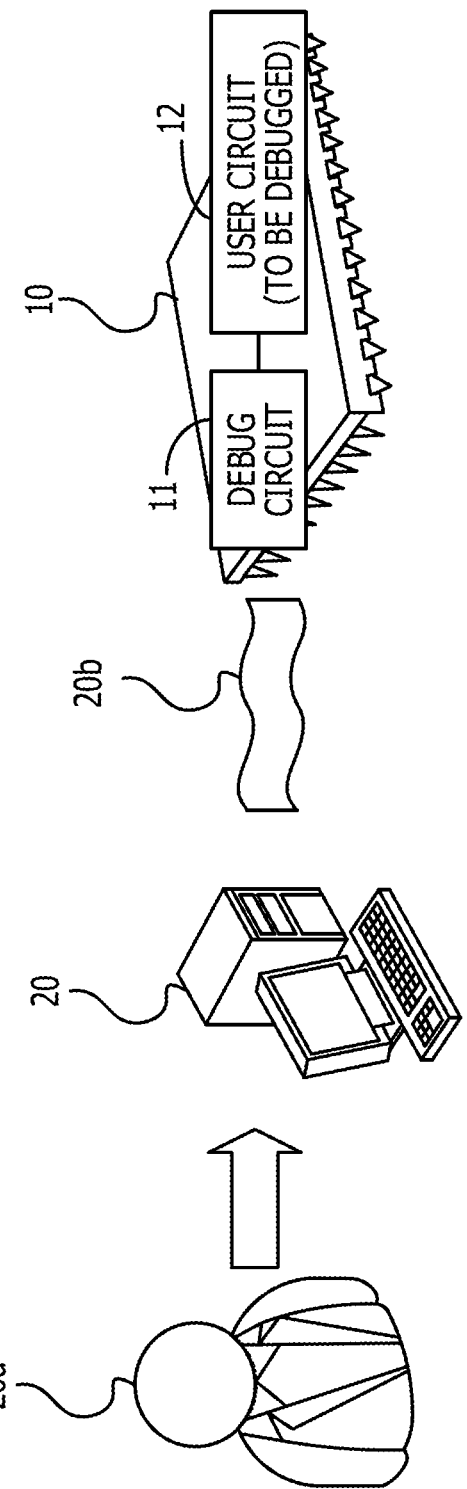
FIG. 2 illustrates an example of a debug system.

FIG. 2 is an example of a debug system.

The debug system illustrated in FIG. 2 includes a semiconductor device 10 and a debugger apparatus 20, which are coupled to each other through a communication cable 20b. The semiconductor device 10 and the debugger apparatus 20 may communicate with each other wirelessly.

The semiconductor device 10 may be, for example, a system on chip (SoC) and includes a debug circuit 11 and a user circuit 12 to be debugged. The debugger apparatus 20 may be, for example, a computer. The debugger apparatus 20 is operated by an operator 20a to communicate with the semiconductor device 10 through the communication cable 20b to perform debugging processing.

Figure 3:
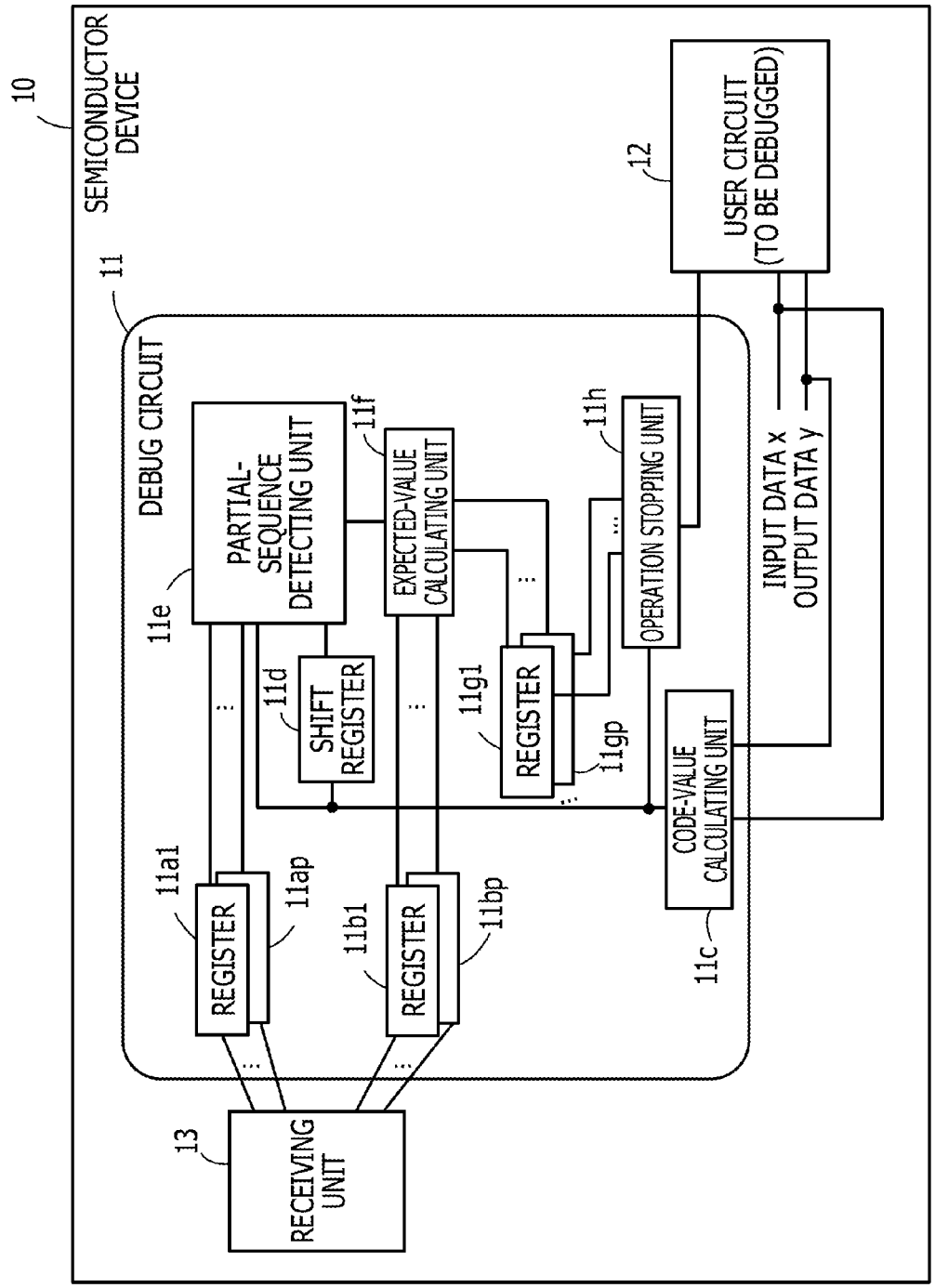
FIG. 3 illustrates an example of a semiconductor device.

FIG. 3 illustrates an example of a semiconductor device. In FIG. 3, the semiconductor device 10 includes a receiving unit 13 in addition to the debug circuit 11 and the user circuit 12. The receiving unit 13 receives data transmitted from the debugger apparatus 20 through the communication cable 20b.

The debug circuit 11 has registers 11a1 to 11ap, registers 11b1 to 11bp, a code-value calculating unit 11c, a shift register 11d, a partial-sequence detecting unit 11e, an expected-value calculating unit 11f, registers 11g1 to 11gp, and an operation stopping unit 11h.

The registers 11a1 to 11ap and the registers 11b1 to 11bp may have, for example, the functions of the storage unit 2a in the debug circuit 2 illustrated in FIG. 1. A random access memory (RAM) may be used instead of the registers 11a1 to 11ap and the registers 11b1 to 11bp.

The registers 11a1 to 11ap store code values obtained by encoding fixed-length-part sequences of a plurality of stopping sequences indicating a plurality of stopping conditions, for example, p stopping conditions. The registers 11b1 to 11bp store code values obtained by encoding the subsequent-part sequences subsequent to the fixed-length parts.

For example, the code values of the fixed-length-part sequence of a stopping sequence indicating a stopping condition are stored in the register 11a1, and the code values of the subsequent-part sequence subsequent to the fixed-length part are stored in the register 11b1.

These code values may be code values encoded by CRC or may be, for example, code values having linearity. The stopping sequence specifies how signals regarding the user circuit 12 are to transition to stop the user circuit 12. The signals regarding the user circuit 12 includes input data, output data, or internal signals of the user circuit 12. Each stopping sequence may be a sequence regarding a transition in a plurality of signals (input data and output data) or may be a sequence regarding a transition in one signal.

Based on the sequence of signals regarding the user circuit 12, the code-value calculating unit 11c calculates code values that change according to a sequence, by using an encoding system that is the same as an encoding system used when the debugger apparatus 20 calculates code values, for example, CRC.

The shift register 11d may have functions of the delay unit 2c in the debug circuit 2 illustrated in FIG. 1. The shift register 11d holds the code values corresponding to the length of the fixed-length-part sequence included in a stopping sequence, the code values being calculated by the code-value calculating unit 11c, and then sequentially outputs the code values on a first-in, first-out basis. In a stopping sequence, the length of the fixed-length-part sequence is set to the length of a sequence of signals for m time points as a sequence of signals of the user circuit 12 at each time point (clock timing). For example, m may be determined based on the size of data that can be held by the shift register 11d.

The partial-sequence detecting unit 11e detects the fixed-length-part sequences of stopping sequences, based on a result of comparing the difference between the code value output from the code-value calculating unit 11c and the code value output from the shift register 11d with the code values stored in the registers 11a1 to 11ap.

Based on the value of addition of the code values when the fixed-length-part sequences are detected and the code values stored in the registers 11b1 to 11bp, the expected-value calculating unit 11f calculates expected values of the code values calculated by the code-value calculating unit 11c at the end of the stopping sequences.

The registers 11g1 to 11gp store expected values corresponding to the respective stopping conditions, the expected values being calculated by the expected-value calculating unit 11f. When the code value output from the code-value calculating unit 11c, for example, the absolute value of the code value, and any of the expected values stored in the registers 11g1 to 11gp match with each other, the operation stopping unit 11h stops the operation of the user circuit 12 to be debugged.

Figure 4:
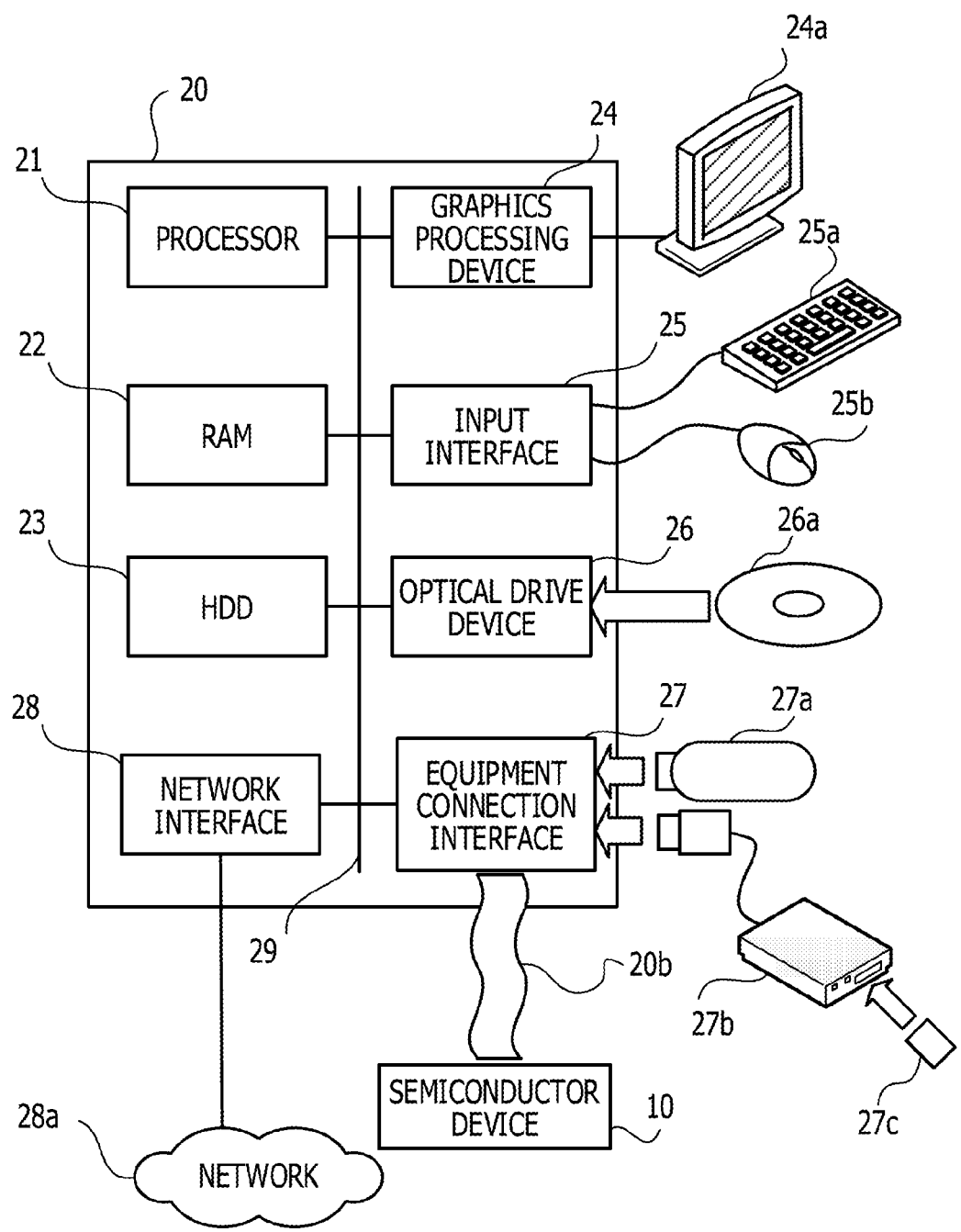
FIG. 4 illustrates an example of a hardware of a debugger apparatus.

FIG. 4 is an example of a hardware of a debugger apparatus.

The debugger apparatus 20 may be a computer, and the entire debugger apparatus 20 is controlled by a processor 21. A RAM 22 and a plurality of units of peripheral equipment are coupled to the processor 21 through a bus 29. The processor 21 may be a multiprocessor. The processor 21 may be, for example, a central processing unit (CPU), a micro processing unit (MPU), a digital signal processor (DSP), an application-specific integrated circuit (ASIC), or a programmable logic device (PLD). The processor 21 may be a combination of two or more elements of a CPU, an MPU, a DSP, an ASIC, and a PLD.

The RAM 22 is used as a main storage device for the debugger apparatus 20. The RAM 22 temporarily stores at least part of an operating system (OS) program and an application program that are executed by the processor 21. The RAM 22 stores various types of data used for processing performed by the processor 21.

The peripheral equipment coupled to the bus 29 includes a hard disk drive (HDD) 23, a graphics processing device 24, an input interface 25, an optical drive device 26, an equipment connection interface 27, or a network interface 28.

The HDD 23 magnetically writes data to and reads data from a built-in disk. The HDD 23 may be used as an auxiliary storage device for the debugger apparatus 20. The HDD 23 stores an OS program, application programs, and various types of data. A semiconductor storage device, such as a flash memory, may be used as the auxiliary storage device.

A monitor 24a is coupled to the graphics processing device 24. In accordance with an instruction from the processor 21, the graphics processing device 24 displays an image including a debugging result and so on a screen of the monitor 24a. The monitor 24a may include a display apparatus using a cathode ray tube (CRT), a liquid-crystal display device, or the like.

A keyboard 25a and a mouse 25b are coupled to the input interface 25. The input interface 25 sends signals, sent from the keyboard 25a and the mouse 25b, to the processor 21. The mouse 25b may be an example of a pointing device or may be implemented by another pointing device. The other pointing device may include a touch panel, a tablet device, a touch pad, a trackball, or the like.

The optical drive device 26 uses laser light or the like to read data recorded on an optical disk 26a. The optical disk 26a is a portable recording medium on which data is recorded so that it is readable through light reflection. The optical disk 26a may include a digital versatile disc (DVD), a DVD-RAM, a compact disc read only memory (CD-ROM), or a compact disc recordable/rewritable (CD-R/RW).

The equipment connection interface 27 may be a communication interface for coupling the peripheral equipment to the debugger apparatus 20. For example, a memory device 27a and a memory reader/writer 27b may be coupled to the equipment connection interface 27. The memory device 27a may be a recording medium having a function of communication with the equipment connection interface 27. The memory reader/writer 27b is an apparatus that writes data to a memory card 27c or that reads data from the memory card 27c. The memory card 27c may be a card-shaped recording medium.

The equipment connection interface 27 is coupled to the semiconductor device 10 through the communication cable 20b. The network interface 28 is coupled to a network 28a. The network interface 28 transmits data to and receives data from another computer or communication equipment through the network 28a.

With a hardware configuration as described above, the processing functions of the debugger apparatus 20 illustrated in FIG. 4 may be executed. The debugger apparatus 4 illustrated in FIG. 1 may have hardware that is the same as or similar to the hardware of the debugger apparatus 20 illustrated in FIG. 3.

The debugger apparatus 20 may execute various processing functions, for example, by executing a program recorded on a computer-readable recording medium. A program that states details of processing to be executed by the debugger apparatus 20 may be recorded to various recording media. For example, the program to be executed by the debugger apparatus 20 may be stored in the HDD 23. The processor 21 loads at least part of the programs in the HDD 23 into the RAM 22 and executes the program. The program to be executed by the debugger apparatus 20 may be recorded to a portable recording medium, such as the optical disk 26a, the memory device 27a, or the memory card 27c. The program stored on the portable recording medium may be executed after installation in the HDD 23, for example, under the control of the processor 21. The processor 21 may directly read the program from the portable recording medium to execute the program.

Figure 5:
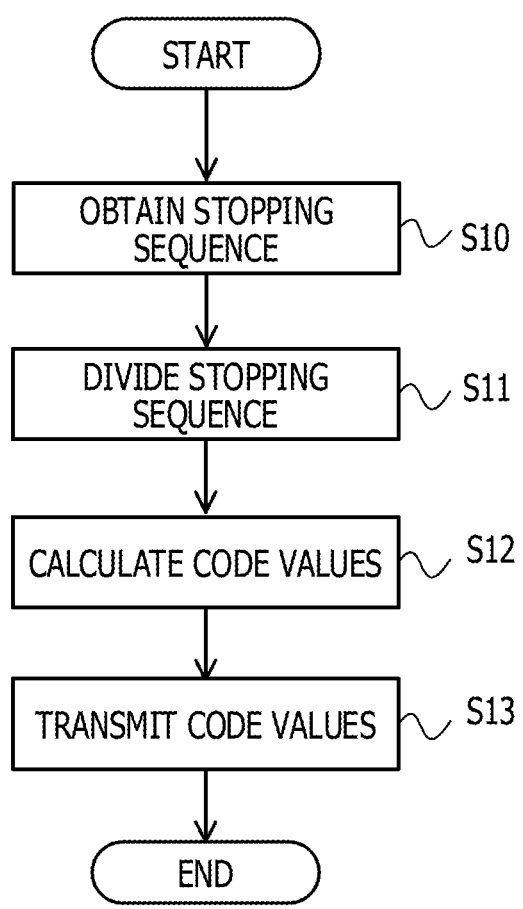
FIG. 5 illustrates an example of processing for setting a stopping condition.

FIG. 5 illustrates an example of processing for setting a stopping condition. The debugger apparatus illustrated in FIG. 4 may perform the setting processing illustrated in FIG. 5.

The debugger apparatus 20 obtains a plurality of stopping sequences input through, for example, operation of the keyboard 25a and/or the mouse 25b by the operator 20a or the like (operation S10). The debugger apparatus 20 divides each stopping sequence into a fixed-length-part sequence and a subsequent-part sequence (operation S11). The debugger apparatus 20 calculates code values obtained by encoding the fixed-length-part sequence and the subsequent-part sequence by using CRC (operation S12). In operation S12, the debugger apparatus 20 calculates the code vales from an initial signal in the fixed-length-part sequence, for example, input data and output data, and updates the code value with a subsequent signal. When code-value updating with a last signal of the fixed-length part sequence is finished, the code value obtained at this point becomes a code value for the fixed-length-part sequence. The subsequent-part sequence is similarly processed, so that a code value is calculated.

The debugger apparatus 20 transmits the code values, calculated in the process in operation S12, to the semiconductor device 10 (operation S13). Thus, the setting processing for the stopping condition for the debugger apparatus 20 ends.

Figure 6:
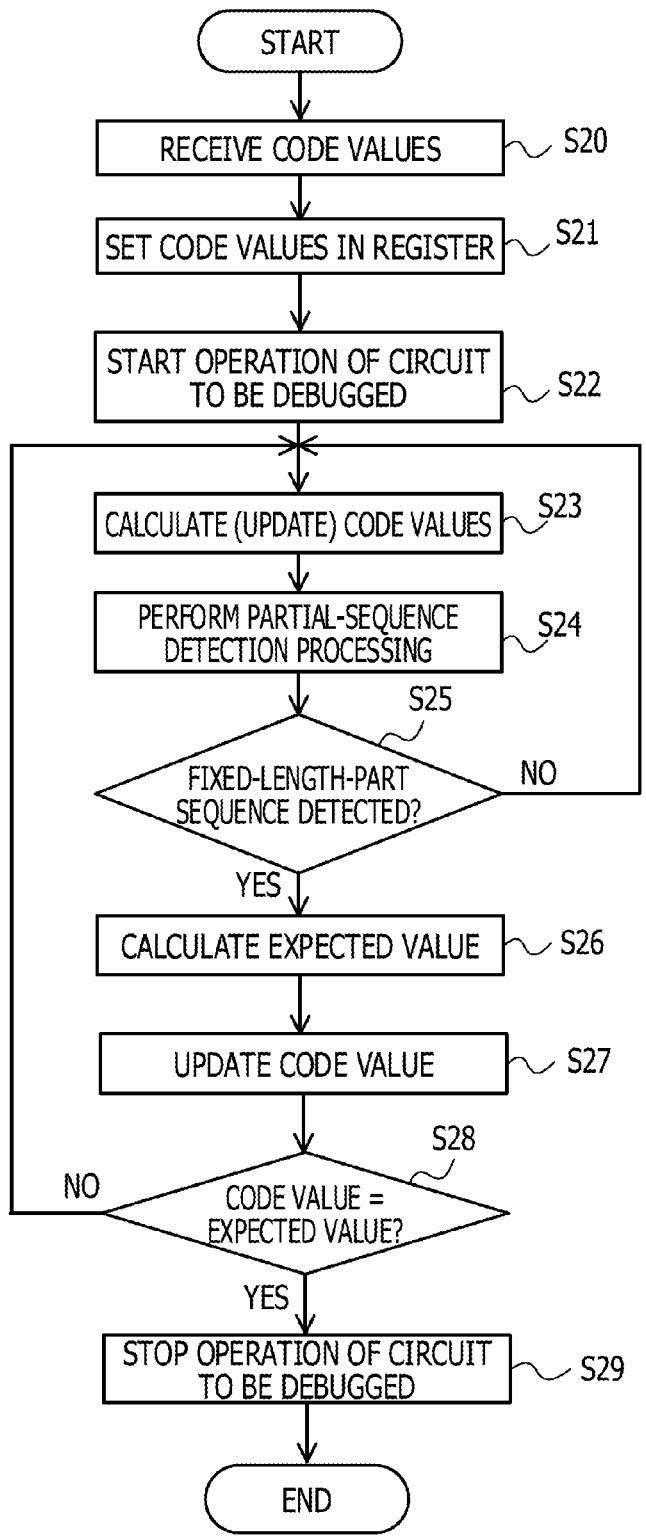
FIG. 6 illustrates an example of processing performed by a semiconductor device.

FIG. 6 is an example of processing performed by a semiconductor device. The receiving unit 13 in the semiconductor device 10 receives the code values transmitted from the debugger apparatus 20 (operation S20). A control unit in the semiconductor device 10 stores the code values of the fixed-length-part sequences of the stopping sequences in the registers 11a1 to 11ap and sets (stores) the code values of the subsequent-part sequences in the registers 11b1 to 11bp (operation S21).

The operation stopping unit 11h in the debug circuit 11 causes the user circuit 12 to be debugged to start operation (operation S22). For example, when the operation stopping unit 11h turns on the supply of a clock signal to the user circuit 12, the user circuit 12 starts the operation.

After the user circuit 12 starts the operation, at each timing of the clock, the code-value calculating unit 11c in the debug circuit 11 calculates code values by using CRC, based on the input data x or the output data y of the user circuit 12 (operation S23).

The partial-sequence detecting unit 11e reads the code values of the fixed-length-part sequences of the stopping sequences stored in the registers 11a1 to 11ap and detects the fixed-length-part sequences of the stopping sequences, as described below (operation S24).

Figure 7:
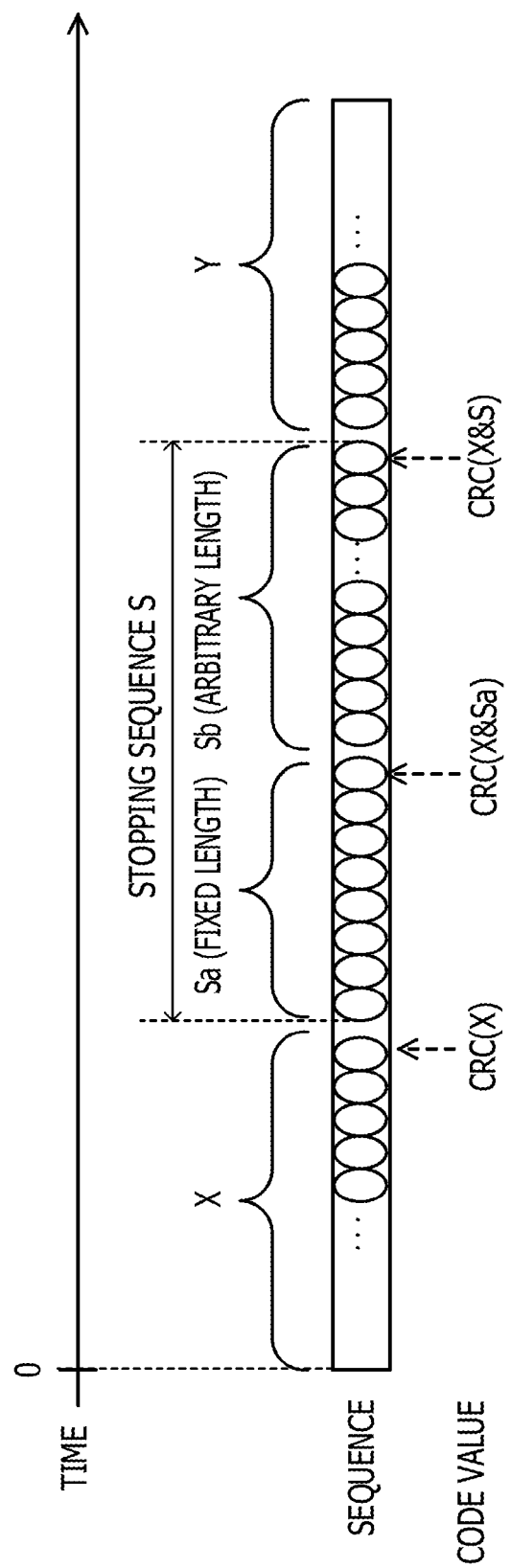
FIG. 7 illustrates an example of a sequence.

FIG. 7 illustrates an example of a sequence. In FIG. 7, the state of signals in the user circuit transitions in a sequence including a stopping sequence. FIG. 7 illustrates a sequence that starts at time point 0. For example, in FIG. 7, a sequence X is followed by a stopping sequence S, which is followed by a sequence Y. FIG. 7 illustrates the code values calculated by the code-value calculating unit 11c. A code value calculated at the end of the sequence X is CRC(X), a code value calculated at the end of a fixed-length-part sequence Sa of the stopping sequence S is CRC(X&Sa), and a code value calculated at the end of a subsequent-part sequence Sb (arbitrary length) is CRC(X&S). Also, "&" represents concatenation of the sequences.

In accordance with CRC linearity, the following equation holds.

$$CRC(X\&S)=CRC((X\&0^m)+(0^k\&Sa))=CRC(X\&0^m)+CRC(0^k\&Sa)=CRC(X\&0^m)+CRC(Sa)=H(m)\cdot CRC(X)+CRC(Sa) \quad (1)$$

In equation (1), "+" represents an XOR arithmetic operation (the same applies to equations below). "$0^m$" represents a sequence in which the signals (the input data x and the output data y) of the user circuit 12 are continuously 0 for m time points. When the length of the sequence X is the length of a sequence of signals of the user circuit 12 for a time length corresponding to k time points, $0^k$ indicates a sequence in which the signals of the user circuit 12 are continuously 0 for the k time points.

Because of the property of CRC, 0s that continue from the initial state do not affect the CRC values, regardless of the number of 0s. Thus, in equation (1), CRC(X&$0^m$)+CRC($0^k$&Sa)=CRC(X&Om)+CRC(Sa) is given.

H(m) in equation (1) is a square matrix for converting the CRC values so as to provide the same effect as &$0^m$. In a CRC arithmetic operation using the square matrix H, for example, a known arithmetic operation described in Non-Patent Literature mentioned above may be used.

Figure 8:
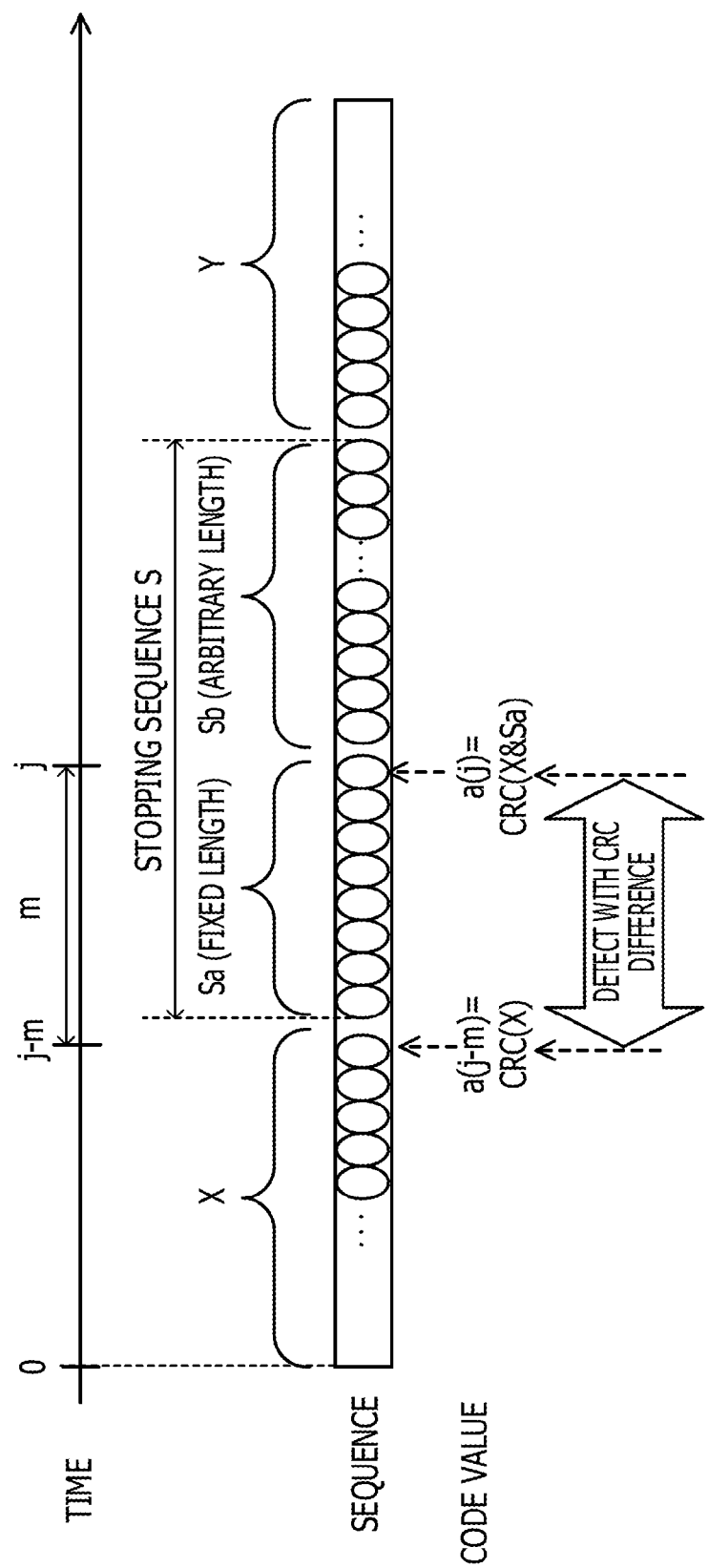
FIG. 8 illustrates an example of detection of a sequence.

FIG. 8 illustrates an example of detection of a sequence. At time point j, the code value calculated by the code-value calculating unit 11c is a(j). At time point j, the shift register 11d outputs a code value a(j−m) for time point j−m, which is m time points (m clock timings) earlier than time point j.

Upon receiving the code values a(j) and a(j−m), the partial-sequence detecting unit 11e evaluates whether or not condition equation (2) based on the difference between the code value a(j) and the code value a(j−m) holds.

$$a(j)-H(m)\cdot a(j-m)=CRC(Sa) \quad (2)$$

Even if the sequence X from time point 0 is unknown, the condition equation (2) holds when the sequence from time point (j−m+1) to time point j matches the sequence Sa.

The partial-sequence detecting unit 11e determines whether or not the fixed-length part sequence is detected, by determining whether or not equation (2) based on a CRC difference, for example, the amount of change in a code value encoded with CRC, holds (operation S25).

When equation (2) holds, the code value a(j−m) is given by a(j−m)=CRC(X), and the code value a(j) is given by a(j)=CRC(X&Sa), and at time point j, the last signal of the sequence Sa of the code values a(j) and a(j−m) is detected, as illustrated in FIG. 8. Thus, when equation (2) holds, the partial-sequence detecting unit 11e determines that the sequence Sa is detected and sends the code value a(j) for time point j to the expected-value calculating unit 11f.

When the fixed-length sequence is not detected, for example, when equation (2) does not hold, the processes from operation S23 are repeated. Upon receiving the code value a(j), the expected-value calculating unit 11f calculates an expected value (operation S26).

Figure 9:
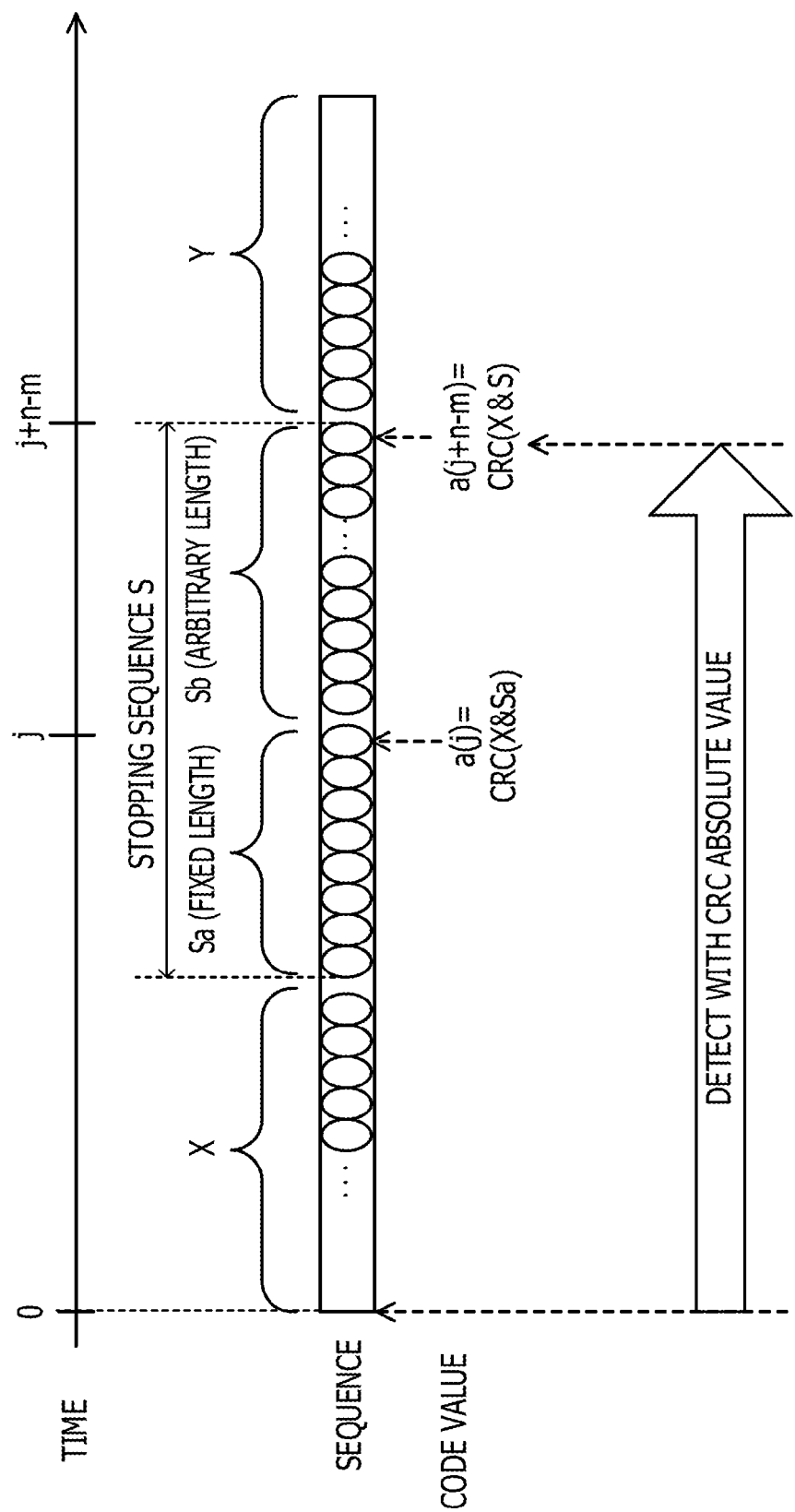
FIG. 9 illustrates an example of calculation of an expected value for detecting a stopping sequence.

FIG. 9 illustrates an example of calculation of an expected value for detecting a stopping sequence. At time point j, a(j)=CRC(X&Sa) is given. When the length of the stopping sequence S is the length of a sequence of signals for n time points, and the sequence Sa is followed by the sequence Sb, an expected value CRC(X&S) of the code value at time point j+n−m is given by the following equation.

$$CRC(X\&S)=CRC(X\&Sa\&Sb)=CRC(X\&Sa\&r^m)+CRC(Sb)=H(n-m)\cdot CRC(X\&Sa)+CRC(Sb) \quad (3)$$

CRC(Sb) represents a code value of the subsequent-part sequence Sb of the stopping sequence S and is stored in any of the registers 11b1 to 11bp.

The expected-value calculating unit 11f reads, from any of the registers 11b1 to 11bp, the code value of the sequence Sb corresponding to the detected fixed-length-part sequence Sa, and uses equation (3) to calculate an expected value.

The code-value calculating unit 11c updates the code value (operation S27), and the operation stopping unit 11h determines whether or not the code value (the CRC absolute value) matches the expected value at time point j+n−m (operation S28). When the code value matches the expected value at time point j+n−m, it is determined that the stopping sequence S is detected, as illustrated in FIG. 9. Thus, the operation stopping unit 11h causes the operation of the user circuit 12 to be debugged to stop (operation S29), thereby ending the stopping processing of the user circuit 12 during detection of a stopping sequence.

The operation stopping unit 11h stops the operation of the user circuit 12, for example, by stopping supply of a clock signal to the user circuit 12 based on a circuit stopping signal. When the operation stopping unit 11h blocks inputting of data to the user circuit 12 or outputting of data from the user circuit 12, the user circuit 12 may be treated as being stopped.

When the code value and the expected value do not match each other at time point j+n−m, the operation stopping unit 11h determines that the stopping sequence S is not detected, and the processes from operation S23 are preformed again.

For example, the debugger apparatus 20 performs debugging work, such as checking signals of the individual units in the user circuit 12. The semiconductor device 10, the debug circuit 11, and the debugger apparatus 20 may provide advantages that are the same as or similar to those of the semiconductor device 1, the debug circuit 2, and the debugger apparatus 4 illustrated in FIG. 1. Since the processing for stopping the user circuit 12 is performed based on the code values of the fixed-length-part sequence and the subsequent-part sequence of each of a plurality of stopping sequences, the user circuit 12 may be stopped with a plurality of stopping conditions.

When the processing of the expected-value calculating unit 11*f* is executed by software in the debugger apparatus 20, the circuit areas of the debug circuit 11 and the semiconductor device 10 may decrease. After the debug circuit 11 detects a fixed-length-part sequence, the debugger apparatus 20 causes the operation stopping unit 11*h* to stop the user circuit 12. The debugger apparatus 20 obtains the code value calculated by the code-value calculating unit 11*c* at the stopping timing of the user circuit 12 and calculates an expected value based on the code value and the code value of the subsequent-part sequence. The debugger apparatus 20 transmits the calculated expected value to the semiconductor device 10, and the semiconductor device 10 sets the expected value in any of the registers 11*g*1 to 11*gp* in the debug circuit 11.

The stopping sequence may be divided into two sequences, for examples, a fixed-length-part sequence and a subsequent-part sequence, and the stopping sequence may be detected based on a code value of each of the sequences. The stopping sequence may be divided into three or more sequences, and the stopping sequence may be detected based on a code value of each of the sequences. For example, the stopping sequence may be detected based on code values of three sequences included in the stopping sequence divided into the three parts.

Figure 10:
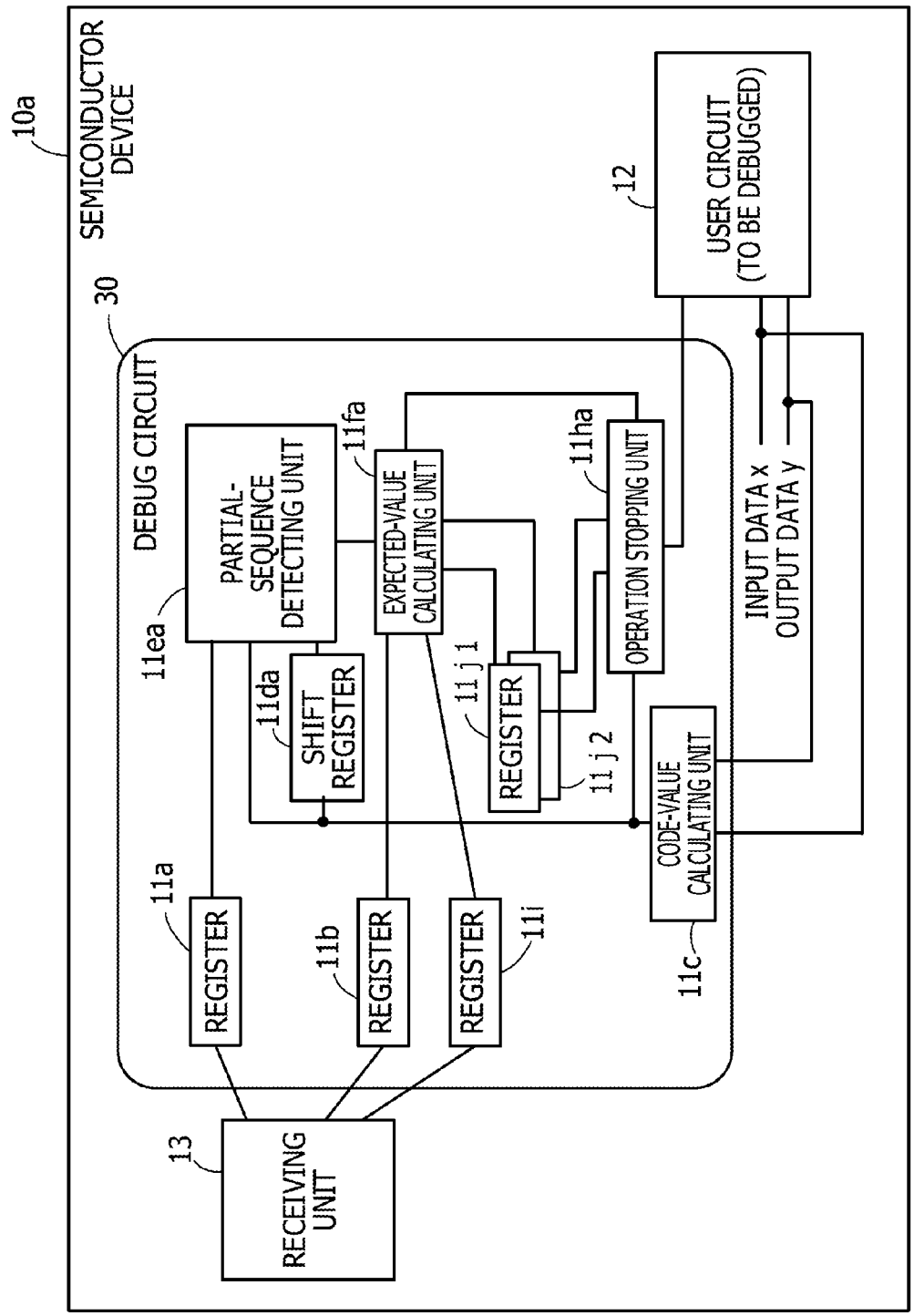
FIG. 10 illustrates an example of a semiconductor device.

FIG. 10 is an example of a semiconductor device. In FIG. 10, elements that are the same as or similar to those in the semiconductor device 10 illustrated in FIG. 3 are denoted by the same reference numerals, and descriptions thereof may be omitted or reduced. For simplification of description below, a debug circuit 30 in a semiconductor device 10*a* detects one stopping sequence. However, the debug circuit 30 may detect a plurality of stopping sequences.

The semiconductor device 10*a* has registers 11*a*, 11*b*, and 11*i*. The register 11*a* stores the code values of a first sequence of three sequences obtained by dividing a stopping sequence into three parts. The register 11*b* stores the code values of a second sequence of the three sequences obtained by dividing the stopping sequence into the three parts. The register 11*i* stores the code values of the last sequence of the three sequences obtained by dividing the stopping sequence into the three parts. The first sequence, the second sequence, and the third sequence of the divided stopping sequences may hereinafter be referred to as a "sequence $S_1$", a "sequence $S_2$", and a "sequence $S_3$", respectively.

The length of the sequence $S_1$ may be a fixed length based on the size of data held by a shift register 11*d*. For example, the length of the sequence $S_1$ may be the length of a sequence of signals for m1 time points (m1 clock timings).

The sequences $S_2$ and $S_3$ may have arbitrary lengths, and information about the lengths is stored in, for example, the registers 11*b* and 11*i*. For example, the length of the sequence $S_2$ may be a length corresponding to m2 time points (m2 clock timings), and the length of the sequence $S_3$ may be a length corresponding to m3 time points (m3 clock timings).

A shift register 11*da* holds the code values corresponding to the length of the sequence $S_1$ (for example, the code values corresponding to the m1 time pints), the code values being calculated by a code-value calculating unit 11*c*, and then sequentially outputs the code values on a first-in, first-out basis. A partial-sequence detecting unit 11*ea* detects the sequence $S_1$, based on a result of comparing the difference between the code value output from the code-value calculating unit 11*c* and the code value output from the shift register 11*da* with the code value stored in the register 11*a*.

An expected-value calculating unit 11*fa* calculates an expected value of the code value calculated by the code-value calculating unit 11*c* at the end of the sequence $S_2$, based on the code value during detection of the sequence $S_1$ and the code value of the sequence $S_2$ which is stored in the register 11*b*. Based on the code value at the time of detection of the sequence $S_2$ and the code value of the sequence $S_3$ which is stored in the register 11*i*, the expected-value calculating unit 11*fa* calculates an expected value of the code value calculated by the code-value calculating unit 11*c* at the end of the stopping sequence. The expected value may be calculated using the linearity of CRC illustrated in equation (3).

Registers 11*j*1 and 11*j*2 store expected values calculated by the expected-value calculating unit 11*f*. The register 11*j*1 stores the expected value of the code value calculated by the code-value calculating unit 11*c* at the end of the sequence $S_2$, and the register 11*j*2 stores the expected value of the code value calculated by the code-value calculating unit 11*c* at the end of the stopping sequence.

When the code value output from the code-value calculating unit 11*c* and the expected value stored in the register 11*j*1 match with each other, an operation stopping unit 11*ha* determines that the sequence $S_2$ is detected. The operation stopping unit 11*ha* causes the expected-value calculating unit 11*fa* to calculate an expected value of the code value calculated by the code-value calculating unit 11*c* at the end of the next sequence $S_3$, for example, at the end of the stopping sequence. When the code value output from the code-value calculating unit 11*c* and the expected value stored in the register 11*j*2 match with each other, the operation stopping unit 11*ha* determines that the sequence $S_3$ is detected, and stops a user circuit 12.

Figure 11:
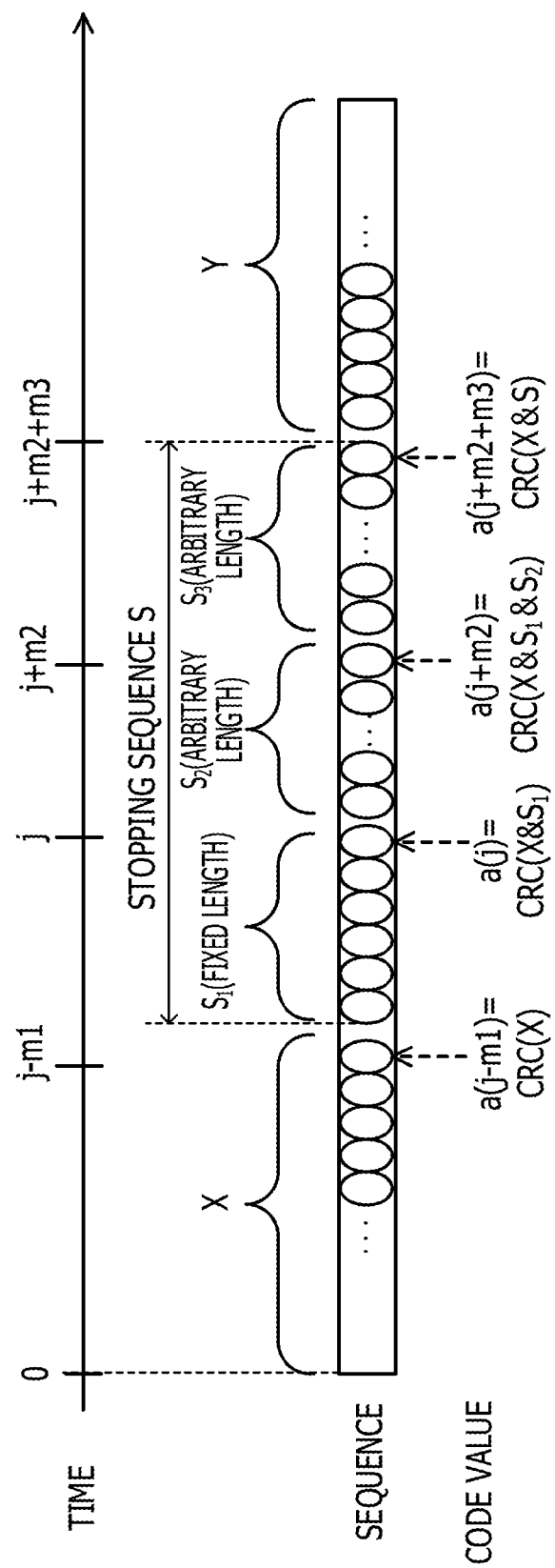
FIG. 11 illustrates an example of stopping-sequence detection processing.

FIG. 11 illustrates an example of stopping-sequence detection processing. In FIG. 11, a stopping sequence divided into three parts is detected. For example, in FIG. 11, at time point j, the partial-sequence detecting unit ilea detects the sequence $S_1$ from the code value stored in the register 11*a*, the code value a(j) at time point j, and the code value a(j−m1) at time point j−m1. In this case, code value a(j−m1)=CRC(X) and code value a(j)=CRC(X&$S_1$) are satisfied.

When the sequence $S_1$ is detected at time point j, the expected-value calculating unit 11*fa* calculates an expected value of the code value calculated by the code-value calculating unit 11*c* at the end of the sequence $S_2$. Since the length of the sequence $S_2$ is, for example, the length corresponding to m2 time points, an expected value of a code value a(j+m2) at time point j+m2 is calculated. This expected value is represented by CRC(X&$S_1$&$S_2$) and is calculated based on the code value a(j) at time point j and the code value (CRC($S_2$)) of the sequence $S_2$ which is stored in the register 11*b*. The calculated expected value is stored in the register 11*j*1.

When the code value a(j+m2) output from the code-value calculating unit 11*c* and the expected value stored in the register 11*j*1 match with each other at time point j+m2, the operation stopping unit 11*ha* determines that the sequence $S_2$ is detected. When the code value a(j+m2) output from the code-value calculating unit 11*c* and the expected value stored in the register 11*j*1 do not match with each other, the operation stopping unit 11*ha* determines that the sequence of the input data x and the output data y is different from the stopping sequence S and does not permit the expected-value calculating unit 11*fa* to calculate an expected value at the end of the next sequence $S_3$.

When the sequence $S_2$ is detected, the expected-value calculating unit 11*fa* calculates an expected value of the code value calculated by the code-value calculating unit 11*c* at the end of the next sequence $S_3$. Since the length of the sequence $S_3$ is, for example, the length corresponding to m3 time points, an expected value of a code value a(j+m2+m3) at time point j+m2+m3 is calculated. This expected value is represented by CRC(X&S) (=CRC(X&$S_1$&$S_2$&$S_3$)) and is calculated based on the code value a(j+m2) at time point j+m2 and a code value (CRC($S_3$)) of the sequence $S_3$ which is stored in the register 11*i*. The calculated expected value is stored in the register 11*j*2.

When the code value a(j+m2+m3) output from the code-value calculating unit 11*c* and the expected value stored in the register 11*j*2 Match with each other at time point j+m2+m3, the operation stopping unit 11*ha* determines that the stopping sequence S is detected. The operation stopping unit 11*ha* causes the operation of the user circuit 12 to stop. When the code value a(j+m2+m3) and the expected value do not match with each other, the operation stopping unit 11*ha* determines that the stopping sequence S is not detected and does not cause the operation of the user circuit 12 to stop.

Since the number of bits in CRC has been determined, the semiconductor device 10*a* may calculate the same CRC value for a plurality of sequences. Accordingly, for example, at time point j+n−m illustrated in FIG. 9, even though a sequence in question is not a stopping sequence, the code value may match an expected value at the end of a stopping sequence S.

The semiconductor device 10*a* makes a determination by comparing the expected value of the code value in the middle of the three divided stopping sequences with the code value calculated by the code-value calculating unit 11*c*. Accordingly, the number of detections as to whether or not the current sequence is a stopping sequence increases. Stopping of the circuit by mistake may be reduced. This effect may increase, as the number of divisions increase.

Figure 12:
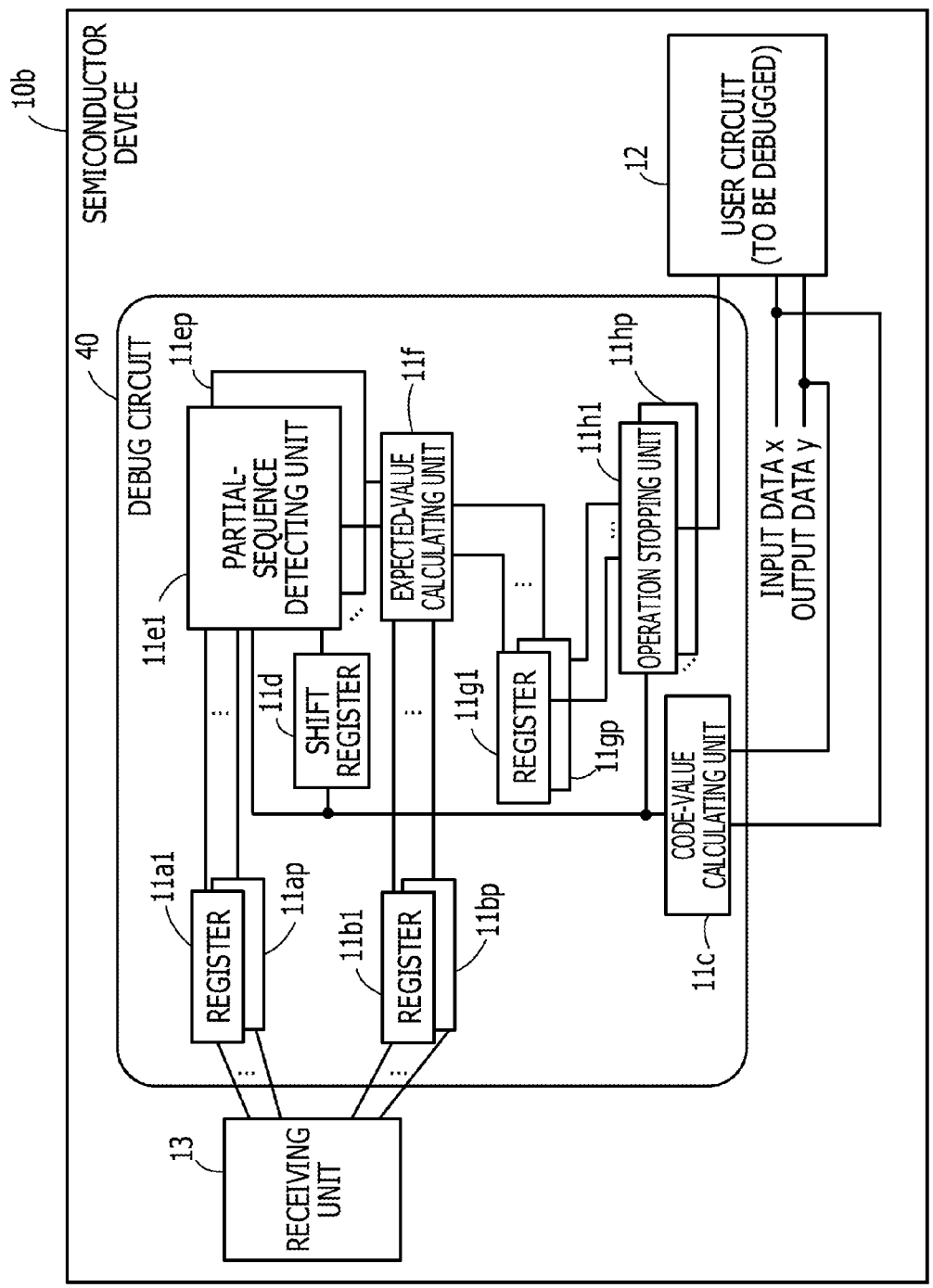
FIG. 12 illustrates an example of a semiconductor device.

FIG. 12 illustrates an example of a semiconductor device. In FIG. 12, elements that are the same as or similar to those in the semiconductor device 10 illustrated in FIG. 3 are denoted by the same reference numerals, and descriptions thereof may be omitted or reduced.

A debug circuit 40 in a semiconductor device 10*b* illustrated in FIG. 12 has p partial-sequence detecting units 11*e*1 to 11*ep* and operation stopping units 11*h*1 to 11*hp* so as to correspond to stopping sequences indicating a plurality of stopping conditions (p stopping conditions).

Each of the partial-sequence detecting units 11*e*1 to 11*ep* receives one of the code values of fixed-length-part sequences of stopping sequences stored in registers 11*a*1 to 11*ap*. For example, the partial-sequence detecting unit 11*e*1 receives the code value stored in the register 11*a*1, and the partial-sequence detecting unit 11*ep* receives the code value stored in the register 11*ap*. The partial-sequence detecting units 11*e*1 to 11*ep* receives the current code value output from the code-value calculating unit 11*c* and receives the code value output from the shift register 11*d*. Based on these code values, the partial-sequence detecting units 11*e*1 to 11*ep* substantially simultaneously detect the fixed-length-part sequences of the stopping sequences.

Each operation stopping units 11*h*1 to 11*hp* receives one of the expected values corresponding to the stopping sequences stored in registers 11*g*1 to 11*gp*. For example, the operation stopping unit 11*h*1 receives the expected value stored in the register 11*g*1, and the operation stopping unit 11*hp* receives the expected value stored in the register 11*gp*. The operation stopping unit 11*hp* receives the current code value output from the code-value calculating unit 11*c*. Based on those code values, the operation stopping units 11*h*1 to 11*hp* substantially simultaneously detect the stopping sequences.

The semiconductor device 10*b* may provide advantages that are the same as or similar to those of the semiconductor device 10 illustrated in FIG. 4. The stopping sequences are substantially simultaneously detected in parallel, so that the work efficiency of debugging may improve.

Figure 13:
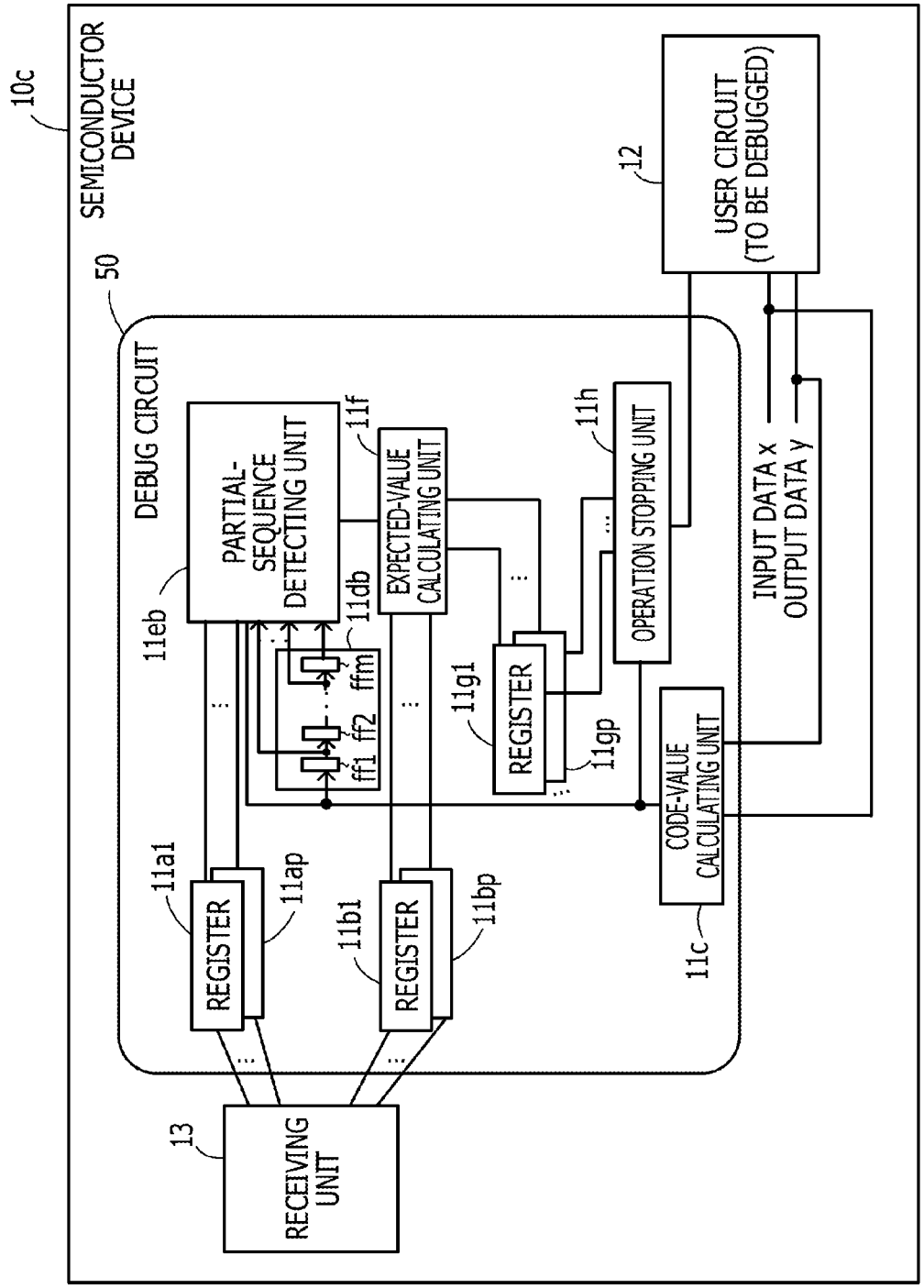
FIG. 13 illustrates an example of a semiconductor device.

FIG. 13 illustrates an example of a semiconductor device. In FIG. 13, elements that are the same as or similar to those in the semiconductor device 10 illustrated in FIG. 3 are denoted by the same reference numerals, and descriptions thereof may be omitted or reduced.

In a debug circuit 50 in a semiconductor device 10*c*, output terminals of flip-flops ff1, ff2, . . . , and ffm included in a shift register 11*db* and coupled in series are coupled to a partial-sequence detecting unit 11*eb*. In FIG. 13, a clock signal may be input to each of the flip-flops ff1 to ffm.

The shift register 11*db* delays outputting of input code values at a plurality of stages. Thus, code values for a time length that is one time point to m time points (for example, one clock timing to m clock timings) earlier relative to the current code value calculated by a code-value calculating unit 11*c* are supplied from the shift register 11*db* to the partial-sequence detecting unit 11*eb*.

The partial-sequence detecting unit 11*eb* detects a fixed-length-part sequence, based on a result of comparing the difference between the code value output from the code-value calculating unit 11*c* and the code value output from any of the flip-flops ff1 to ffm with the code values stored in registers 11*a*1 to 11*ap*.

In the semiconductor device 10 illustrated in FIG. 4, the shift register 11*d* outputs a code value for a time point that is m time points earlier relative to the current code value calculated by the code-value calculating unit 11*c*, and the length of the fixed-length-part sequence of the stopping sequence is the length corresponding to the m time points. Since the semiconductor device 10*c* illustrated in FIG. 13 has the shift register 11*db* and the partial-sequence detecting unit 11*eb*, it is possible to detect the sequence, even when the length of the fixed-length-part sequence of the stopping sequence is smaller than the length corresponding to the m time points. Thus, a stopping sequence that is shorter than the length corresponding to the m time points is detected. Accordingly, the number of stopping sequences that can be dealt with increases, so that various stopping conditions may be handled, and the work efficiency for debugging may increase.

Figure 14:
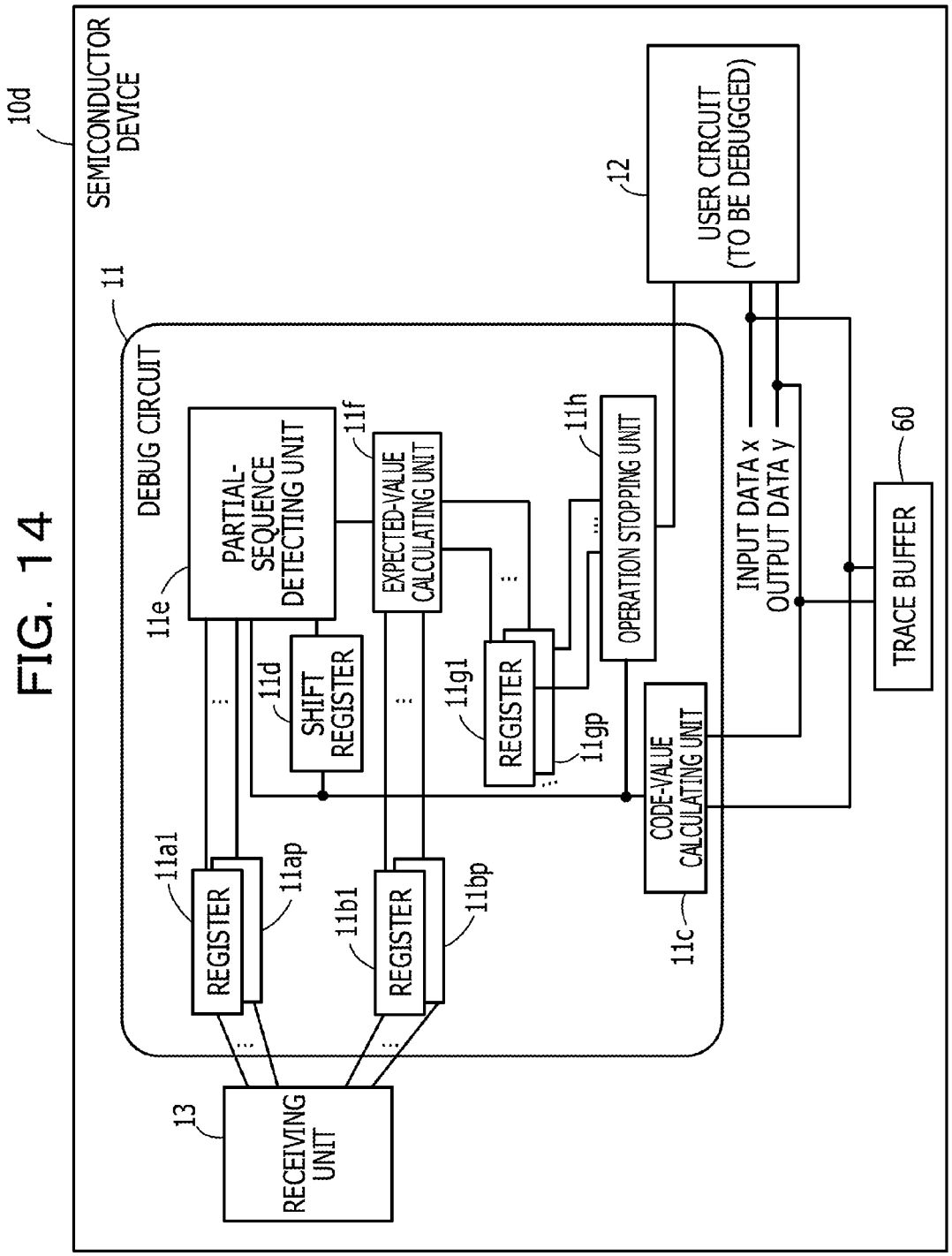
FIG. 14 illustrates an example of a semiconductor device.

FIG. 14 illustrates an example of a semiconductor device. In FIG. 14, elements that are the same as or similar to those in the semiconductor device 10 illustrated in FIG. 3 are denoted by the same reference numerals, and descriptions thereof may be omitted or reduced.

A semiconductor device 10*d* illustrated in FIG. 14 has a trace buffer 60. The trace buffer 60 holds a sequence of signals (the input data x and the output data y) of a user circuit 12 to be debugged.

To what degree the trace buffer 60 holds the sequence of signals of the user circuit 12 may be determined considering an increase in the circuit area, or setting may be performed so that the sequence of signals is held by an amount corresponding to the length of the stopping sequence. In this case, a determination may be made as to whether or not the sequence that is held completely matches the stopping sequence.

FIG. 15 illustrates an example of a debug method using a trace buffer. The processes up to operation S29 may be substantially the same as or similar to the processes illustrated in FIG. 6. When an operation stopping unit 11h stops the operation of the user circuit 12 to be debugged, a debugger apparatus 20 reads the state of the user circuit 12, for example, a sequence of signals, from the trace buffer 60 (operation S30). The debugger apparatus 20 determines whether or not a stopping condition is satisfied and whether or not the stopping sequence and the read sequence of signals match with each other partly or completely (operation S31). For example, when a sequence of signals which is longer than or equal to the length of a stopping sequence which corresponds to n time points is held in the trace buffer 60, and a sequence of signals for latest n time points and the stopping sequence match with each other, it may be determined that the stopping condition is satisfied.

For example, when a sequence of signals which is shorter than the length of a stopping sequence which corresponds to n time points is held in the trace buffer 60, and the sequence of all of the held signals and a part of the stopping sequence match with each other, it may be determined that the stopping condition is satisfied.

When it is determined that the stopping condition is satisfied, the stopping processing of the user circuit 12 during detection of a stopping sequence ends. When it is determined that the stopping condition is not satisfied, the debugger apparatus 20 causes the operation stopping unit h in the debug circuit 11 in the semiconductor device 10d to resume the operation of the user circuit 12.

Since the number of bits in CRC has been determined, the same CRC value may be calculated for a plurality of sequences. Accordingly, for example, at time point j+n−m illustrated in FIG. 9, even though a sequence in question is not a stopping sequence, the code value may match an expected value at the end of a stopping sequence S.

In the debug method illustrated in FIG. 15, the debugger apparatus 20 verifies whether or not a stopping condition is satisfied based on a sequence of signals held in the trace buffer 60 in the semiconductor device 10d. Accordingly, stopping of the user circuit 12 by mistake may be suppressed.

The embodiments described above may be combined together.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A debug circuit, comprising:
a first memory configured to store a program; and
a processor configured to execute the program to perform operations to:
store, in a second memory, a first code value which is calculated using an encoding system, which generates code values based on respective sequences corresponding to signals input to and output from a hardware circuit to be debugged, based on a first sequence, which is included in a stopping sequence indicating a condition for stopping the hardware circuit, and a second code value which is calculated using the encoding system based on a second sequence, which is included in the stopping sequence;
calculate, using the encoding system, a third code value based on a third sequence;
generate a fourth code value corresponding to a fourth sequence which appears earlier than the third sequence by a time length corresponding to a length of the first sequence;
detect the first sequence based on a result of comparing a difference between the third code value and the fourth code value with the first code value;
calculate a first expected value of the third code value at an end of the stopping sequence, based on the third code value when detecting the first sequence and the second code value;
calculate, using the encoding system, a new third code value based on a new third sequence; and
stop an operation on the hardware circuit when the new third code value and the first expected value match with each other to perform a debug operation of the hardware circuit.

2. The debug circuit according to claim 1, wherein the code values calculated by the encoding system change in accordance with the signals input and output to the hardware circuit.

3. The debug circuit according to claim 1, wherein the debug operation includes checking a change of a signal in the hardware circuit before a stop of the operation of the hardware.

4. The debug circuit according to claim 1, wherein the fourth code value is output from a shift register.

5. The debug circuit according to claim 1, wherein the first to fourth code values are code values having linearity.

6. The debug circuit according to claim 1, wherein the processor:
stores, in the second memory, a fifth code value obtained by performing a calculation, using the encoding system, based on a fifth sequence which is included in the stopping sequence and is provided between the first sequence and the second sequence;
calculates a second expected value of the third code value at an end of the fifth sequence, based on the third code value when detecting the first sequence and the fifth code value; and
compares the new third code value with the second expected value.

7. The debug circuit according to claim 6, wherein the processor calculates the first expected value, when the third code value and the second expected value match with each other, and does not calculate the first expected value when the third code value and the second expected value do not match with each other.

8. The debug circuit according to claim 4, wherein the shift register outputs a plurality of fourth code values by delaying the outputting of the third code value at a plurality of stages; and
the processor detects the first sequence, based on a result of comparing a difference between the third code value and one of the plurality of fourth code values with the first code value.

9. A semiconductor device, comprising:
a hardware circuit to be debugged; and
a debug circuit configured to debug the hardware circuit, wherein the debug circuit includes a processor which performs, based on a program, operations to:

store, in a second memory, a first code value which is calculated using an encoding system, which generates code values based on respective sequences corresponding to signals input to and output from the hardware circuit to be debugged, based on a first sequence, which is included in a stopping sequence indicating a condition for stopping the hardware circuit, and a second code value which is calculated using the encoding system based on a second sequence, which is included in the stopping sequence;

calculate, using the encoding system, a third code value based on a third sequence;

generate a fourth code value corresponding to a fourth sequence which appears earlier than the third sequence by a time length corresponding to a length of the first sequence;

detect the first sequence based on a result of comparing a difference between the third code value and the fourth code value with the first code value;

calculate a first expected value of the third code value at an end of the stopping sequence, based on the third code value when detecting the first sequence and the second code value;

calculate, using the encoding system, a new third code value based on a new third sequence; and stop an operation on the hardware circuit when the new third code value and the first expected value match with each other to perform a debug operation of the hardware circuit.

10. The semiconductor device according to claim 9, wherein the code values calculated by the encoding system change in accordance with the signals input and output to the hardware circuit.

11. The semiconductor device according to claim 9 wherein the debug operation includes checking a change of a signal in the hardware circuit before a stop of the operation of the hardware circuit.

12. The semiconductor device according to claim 9, wherein the fourth code value is output from a shift register.

13. The semiconductor device according to claim 9, wherein the first to fourth code values are code values having linearity.

14. The semiconductor device according to claim 9, wherein the processor:

stores, in the second memory, a fifth code value obtained by performing a calculation, using the encoding system, based on a fifth sequence which is included in the stopping sequence and is provided between the first sequence and the second sequence;

calculates a second expected value of the third code value at an end of the fifth sequence, based on the third code value when detecting the first sequence and the fifth code value; and compares the new third code value with the second expected value.

15. The semiconductor device according to claim 14, wherein the processor calculates the first expected value, when the third code value and the second expected value match with each other, and does not calculate the first expected value when the third code value and the second expected value do not match with each other.

16. The semiconductor device according to claim 12, wherein the shift register outputs a plurality of fourth code values by delaying the outputting of the third code value at a plurality of stages; and the processor detects the first sequence, based on a result of comparing a difference between the third code value and one of the plurality of fourth code values with the first code value.

17. A debug method, comprising:

storing, in a second memory, a first code value which is calculated using an encoding system, which generates code values based on respective sequences corresponding to signals input to and output from a hardware circuit to be debugged, based on a first sequence, which is included in a stopping sequence indicating a condition for stopping the hardware circuit, and a second code value which is calculated using the encoding system based on a second sequence, which is included in the stopping sequence;

calculating, using the encoding system, a third code value based on a third sequence;

generating a fourth code value corresponding to a fourth sequence which appears earlier than the third sequence by a time length corresponding to a length of the first sequence;

detecting the first sequence based on a result of comparing a difference between the third code value and the fourth code value with the first code value;

calculating a first expected value of the third code value at an end of the stopping sequence, based on the third code value when detecting the first sequence and the second code value;

calculating, using the encoding system, a new third code value based on a new third sequence; and stop an operation on the hardware circuit when the new third code value and the first expected value match with each other to perform a debug operation of the hardware circuit.

18. The debug method according to claim 17, further comprising:

reading input and output signals held in a trace buffer when stopping the hardware circuit; and a determination is made as to whether or not the input and output signals partly or completely match the stopping sequence, and when there is no match, the hardware circuit to be debugged is released from the stopping.

19. The debug method according to claim 17, wherein the debug operation includes checking a change of a signal in the hardware circuit before a stop of the operation of the hardware circuit.

* * * * *